(12) United States Patent
Strassmann

(10) Patent No.: US 6,506,614 B1
(45) Date of Patent: Jan. 14, 2003

(54) METHOD OF LOCATING AND PLACING EYE POINT FEATURES OF A SEMICONDUCTOR DIE ON A SUBSTRATE

(75) Inventor: Allan Wallace Strassmann, Bensalem, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/059,712

(22) Filed: Jan. 29, 2002

(51) Int. Cl.[7] .............................................. H01L 21/00
(52) U.S. Cl. .......................................................... 438/7
(58) Field of Search ............................... 438/14, 7, 10; 356/623; 205/83; 250/201.5

(56) References Cited

U.S. PATENT DOCUMENTS

| | | | | |
|---|---|---|---|---|
| 3,475,805 A | | 11/1969 | Rottmann | |
| 4,238,780 A | | 12/1980 | Doemens | |
| 4,441,205 A | | 4/1984 | Berkin | |
| 4,585,933 A | * | 4/1986 | Ando | 250/201.5 |
| 5,157,734 A | | 10/1992 | Chen | |
| 5,189,707 A | | 2/1993 | Suzuki | |
| 5,559,727 A | | 9/1996 | Deley | |
| 5,600,733 A | | 2/1997 | MacDonald | |
| 5,801,432 A | * | 9/1998 | Rostoker | 205/83 |
| 6,031,242 A | | 2/2000 | Hudson | |
| 6,094,268 A | * | 7/2000 | Yooshitada | 356/623 |

* cited by examiner

*Primary Examiner*—John F. Niebling
*Assistant Examiner*—Andre C Stevenson

(57) ABSTRACT

A pick and place machine having both a pick preview look down vision system and a horizontal vision system is employed to sense the top surface of the component before picking it up with the pick preview vision system. After pick up the horizontal vision system is employed while transporting the component to a placement position on a substrate to determine the centroid and zero rotational axis of the component and an offset correction to a desired active feature on the component. The centroid of the desired active feature on the component may then be placed on an exact predetermined point on the substrate in a minimum of time and error.

5 Claims, 6 Drawing Sheets

METHOD OF LOCATING AND PLACING EYE POINT FEATURES OF A SEMICONDUCTOR DIE ON A SUBSTRATE

BACKGROUND OF THE INVENTION

1. Field of the Invention

The present invention relates to pick and place machines used in the assembly of components on substrates and printed circuit boards, etc. More particularly, the present invention relates to a new method for placing an eye point or feature of a semiconductor die in a precise registration with a target eye point on the substrate or carrier or printed circuit board.

2. Description of the Prior Art

The present invention involves the use of known prior art pick and place machines which are manufactured and sold by over twenty major manufacturers worldwide. Heretofore, components such as semiconductor chips, resisters, capacitors, inductors, etc. are picked from the pockets of tape feeders or waffle packs, etc. and were placed on a precise target location on a substrate or PC board. The component to be placed cannot be picked up in perfect orientation for placement, thus, it is necessary to use some form of vision system after picking up the component and before placement to assure proper placement registration.

Modern pick and place machines are provided with pick up heads having a vacuum nozzle movable in the vertical or Z direction. The head or heads are mounted on an X-Y gantry which permits any component picked from a supply location to be transferred to a target or placement location and placed on a substrate or PC board. The problem of highly accurate positioning can be resolved by transporting the picked component over a look-up vision system having a known physical displacement from the placement location. The actual position of the pattern on the bottom of the die or the edges of the die can easily be determined by the vision system. Corrections are made for X-Y and theta (θ) pick-up errors and the placement of the components can be made to the accuracy permitted by the gantry drives and encoder in the pick and place machines. Such vision systems are supplied to manufacturers of pick and place machines by Cognex, ICOS, and AISI and others.

In order to assure more accurate pick-up of components, manufacturers of pick and place machines have placed look down vision systems on the pick-up head which determine the size, type and orientation of a component prior to picking up the component with a vacuum nozzle. Such systems are needed when components are placed in waffle trays where the component can move and lose their original orientation.

As an alternative, on the head horizontal imaging systems such as that shown and described in U.S. Pat. No. 5,559,727 may be used in place of a look up vision system. Since the horizontal vision system operates on the fly, substantial time savings can be made.

All of the types of vision systems can be incorporated into most pick and place machines which are employed to place components on substrates. It has been suggested that these machines be modified to solve a problem that has arisen with the manufacture of fiber optic connectors or interfaces. It is recognized that the look up vision system can be used to accurately place the bottom features or edges of a component on a target position on a substrate. However, if a fiber optic diode detector is on the upper surface of the die, the look up system only places the features with the accuracy of which the feature is positioned to the edges of the die. Since most die are saw cut from a wafer, the edges of the die outside the surface pattern may vary a few one-thousandths of an inch. If a plurality of diode drivers or sensor chips are placed on a substrate connecter with an error introduced by the variable width of the street material outside of the circuit pattern, there may be an accumulated error difference between different die on the same substrate.

Accordingly, a simple method of eliminating deviation errors between different die when the distance varies from the edge of the die to an active feature is needed.

SUMMARY OF THE INVENTION

It is a principal object of the present invention to provide a novel method of placing die or components having active surface features so that the feature and not the predetermined edges of the die are placed on a target position.

It is a principal object of the present invention to provide a method of locating features on top of a die onto substrates so that the feature and not the edges of the die are located relative to each other as accurately as the pick and place machine can locate die on a placement target.

It is a principal object of the present invention to provide a substrate populated with a plurality of die so that the active features on the different die are located relative to each other as accurately as the pick and place machine is capable of placing components.

It is a general object of the present invention to provide a substrate populated with plural light sensitive detectors or emitters located apart from each other on a known or standard spacing or pitch with a minimum of deviation error.

It is a general object of the present invention to provide a prior art look down camera on the head of a pick and place machine to determine the position of a die before pick up and using the standard look down vision system to determine a center target and orientation of the die prior to picking up with a vacuum nozzle. Further, with the information acquired by the look down camera the position of the active feature to be placed relative to the perimeter edges can be determined so that the eye point of the active feature and not the edges of the component may be placed on the desired X-Y target.

It is a general object of the present invention to provide a substrate for a connector on which a plurality of active features or components or die are mounted precisely spaced one from another using existing pick and place machines.

It is a general object of the present invention to provide a known pick and place machine with a pick preview vision camera system and a horizontal imaging system programmed to place surface features on the die at a predetermined X and Y target position on a substrate.

It is a general object of the present invention to provide a method that may be used in known commercially available pick and place machines that eliminates the need a look up vision system and enables continuous on the fly placement of components having active top surface features.

According to these and other objects of the present invention there is provided a pick and place machine with a pick preview vision system on the pick up head for obtaining an X-Y location of a feature on the die. The system determines the centroid of the feature on the die to be placed. Having a horizontal on the fly vision system on the same pick up head,the system determines the centroid of the same die in space relative to the vision system, thus permits the control system to determine the offset error for accurate placement of the surface feature on the die on the predetermined X-Y position of the substrate.

DESCRIPTION OF THE PREFERRED EMBODIMENTS

Figure 1:
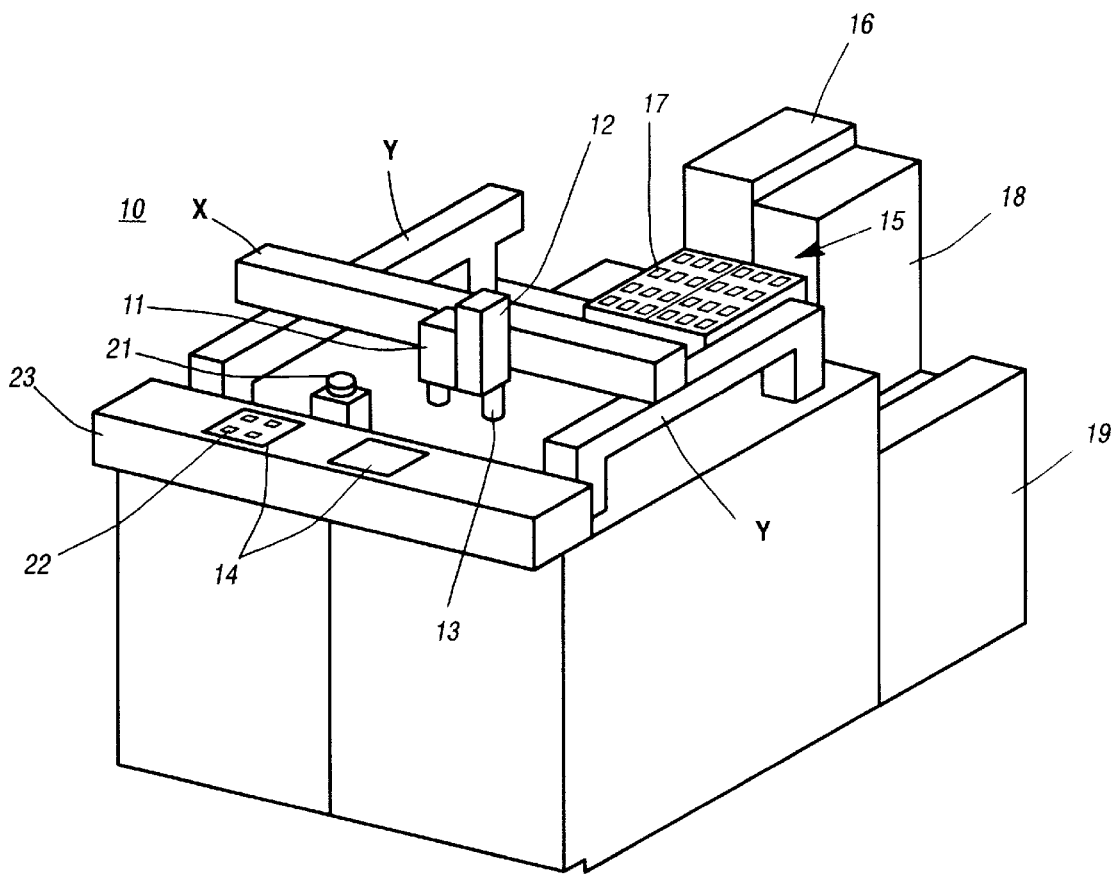
FIG. 1 is a schematic drawing of a prior art pick and place machine having a look down vision system and a look up vision system.

Refer now to FIG. 1 showing an isometric drawing of a typical prior art pick and place machine 10 that is provided with a look down camera 11 on a movable head 12. The look down camera 11 is used for several purposes. When setting up the machine 10 the vision system and camera 21 is used to determine the location of the pick up nozzle 13 in the X and Y system coordinates of the machine 10 and to determine the location of a substrate 14 in the same coordinate system. Before picking up a die or component 17, the same camera is used to set up the location of the pick up station of a tape feeder (not shown) and to establish the location of wafer trays 15 that are provided from an elevated supply system 16.

After set up, the coordinates of the pockets of the wafer tray 15 are known and the target or placement position on the substrate 14 are known. What is not known is the exact position of component 17 in the wafer tray before pick up and the X and Y and rotational position of the component relative to the pick up nozzle 13 after being picked up.

The typical prior art sequence after set up comprises positioning the look down camera with the X-Y gantries over a pocket containing a component to be placed. A frame grab of the component 17 is acquired and transferred to the image processor 18. The commercially available vision systems include image processors 18 capable of determining the centroid or center of area of the component and its X and Y location in the machine coordinate system. Such image processors 18 are also capable of determining the presence of a component as well as its rotational position and size which enables the image processor 18 to identify the component and to determine which of four possible 90 degree rotational positions the component may have acquired prior to pick up. The sequence of operations referred to "pick preview" enables the control and sequencing system 19 to direct a movable head and its pick up nozzle 13 to a desired pick up point on the component which is usually the centroid of the area of the component. Depending on the type of component being placed such as an exposed surface integrated circuit with pads or leads, there may or may not be an exposed circuit pattern on the upper surface. However, when a circuit pattern is exposed, the data in the frame grab stored in the image processor 18 enables the control system 19 to determine the rotation of any point or line on the circuit pattern as well as the area centroid's X, Y location relative to the sides of the component or relative to the centroid of the area of the component as distinguished from the centroid of the circuit pattern.

Pick and place system 10 employs a look up vision system 21 to determine the X and Y rotational position of a component 22 after pick up by the nozzle 13. While it is possible to determine the position of a component on the substrate 14, the actual location of the component on the nozzle 13 is made with the look up vision system 21. If the component has leads or pins or bumps which may be viewed from below, the look up vision system 21 can determine the actual location relative to the vision system 21 and calculate a correction in X and Y and theta (θ) to permit the component 17 to be placed on the substrate 14 at an exact predetermined placement position.

Figure 2:
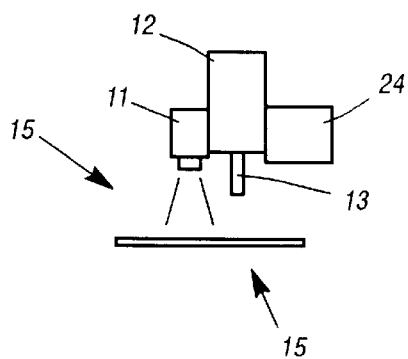
FIG. 2 is a schematic drawing of a prior art pick up head having a horizontal vision system mounted on the movable head.

Refer now to FIG. 2 showing a schematic drawing in elevation of a pick up head 12 having a horizontal vision system 24 mounted on the head 12 for movement therewith. Such a vision system is shown described in U.S. Pat. No. 5,559,727 and have been incorporated into prior art pick and place machines of the type shown in FIG. 1 at least since 1996. The advantage to the horizontal vision system 24 is that the calculation of the offset position of the component 17 or 22 on the nozzle 13 can be made while transferring the component from the pick up position to the placement position without having to stop, slow down or detour to a look up camera. The advantage to the horizontal vision system shown in the above-mentioned patent is that it is operable to view the sides of the component and/or the leads and pins or bumps of a surface mounted device (SMT) and place the leads, pins or bumps precisely on a conductive circuit pattern on a substrate or circuit board with a minimum of error or calculation.

Figure 3:
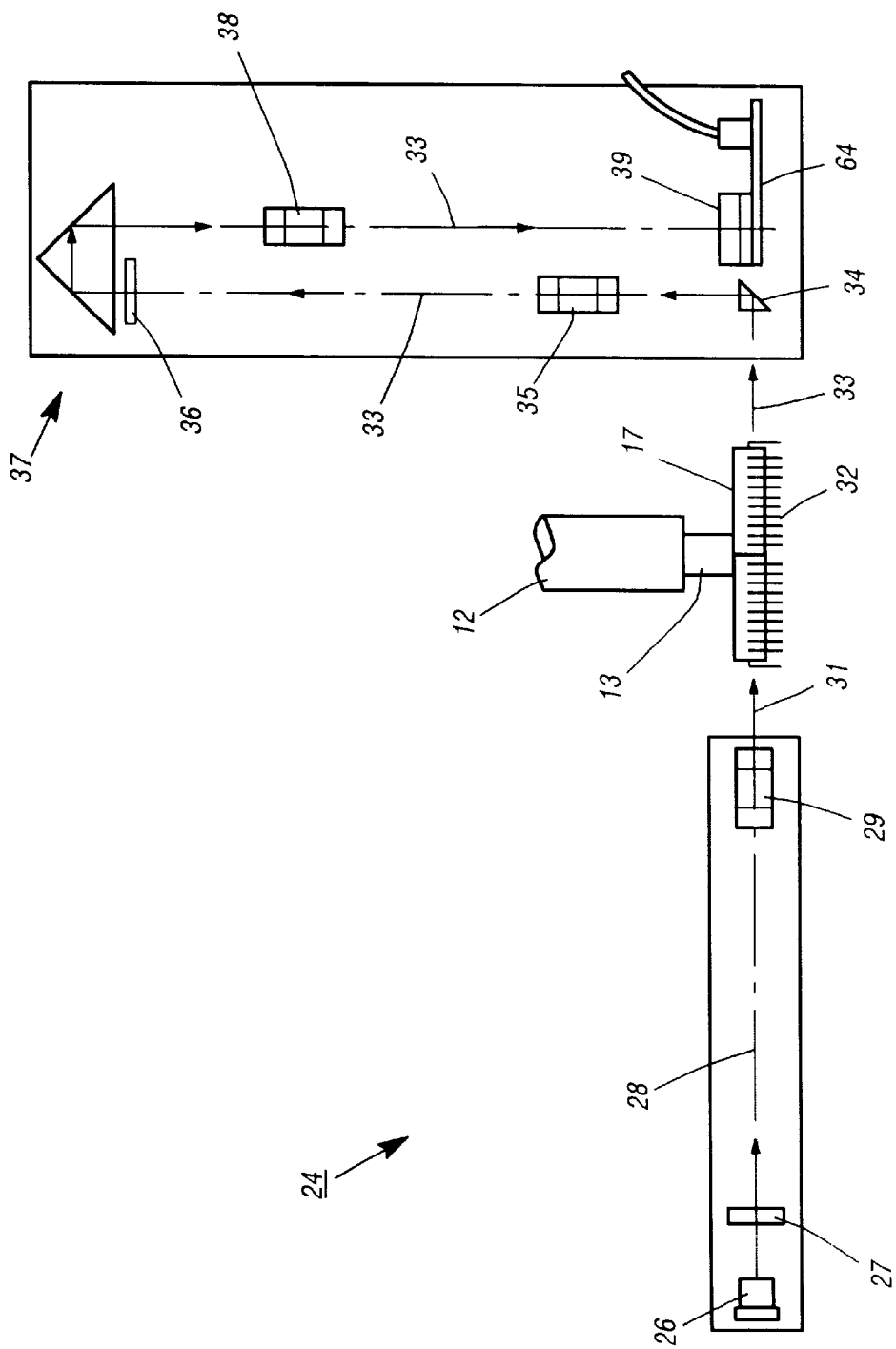
FIG. 3 is a side elevation of a prior art horizontal vision system that has been mounted on the pick up head of the prior art pick and place machine shown in FIGS. 1 and 2.

Refer now to FIG. 3 showing a side elevation drawing of the principal elements of a horizontal vision system 24 preferably employed in the present invention. A non-coherent light source 26 and defusing lens 27 generate a thin fan of light 28 that is directed through a positive collimating lens 29 to produce parallel rays of light in a thin wide sheet of light 31. The sheet of light 31 passes through and past a plurality of leads 32 extending from the component 17. The pick up tool 13 or nozzle 13 is mounted for vertical and rotational movement in the head 12 which is capable of X-Y movement as described hereinbefore. Light 33 that passes through the leads 32 is directed onto a right angle prism 34 where it is directed upward through a positive objective lens 35. The light 33 is converged through an aperture plate 36 and passes through a roof or 180 degree prism 37, then through a relay lens 38 and onto a high definition CCD (HDCCD) linear array 39. The light that passes through or past the leads 32 is sharply refocused onto the linear array 39 as a bright image by the telecentric system of FIG. 3. The preferred mode of operation is to rotate the component 17 in the light path and to determine its zero or 90 degree orthogonal axis position without need for ever knowing its actual pick up rotational position. The center of the component or the center of the leads is employed to determine the amount of offset in the X or Y direction relative to the linear array 39. The delta X and delta Y offset so measured permits the offset correction before placement with a minimum of calculation. The procedure is effective to determine a centroid of the leads 32 and/or a centroid of the component 17 and relate it to the coordinate system of the pick and place machine 10.

It will be understood that the control system 19 is not limited to placement of components at only zero or 90 degrees. The centroid of the component or leads once determined may be placed at any angle on a predetermined placement position on a substrate 14 or PC board, etc.

Figure 4:
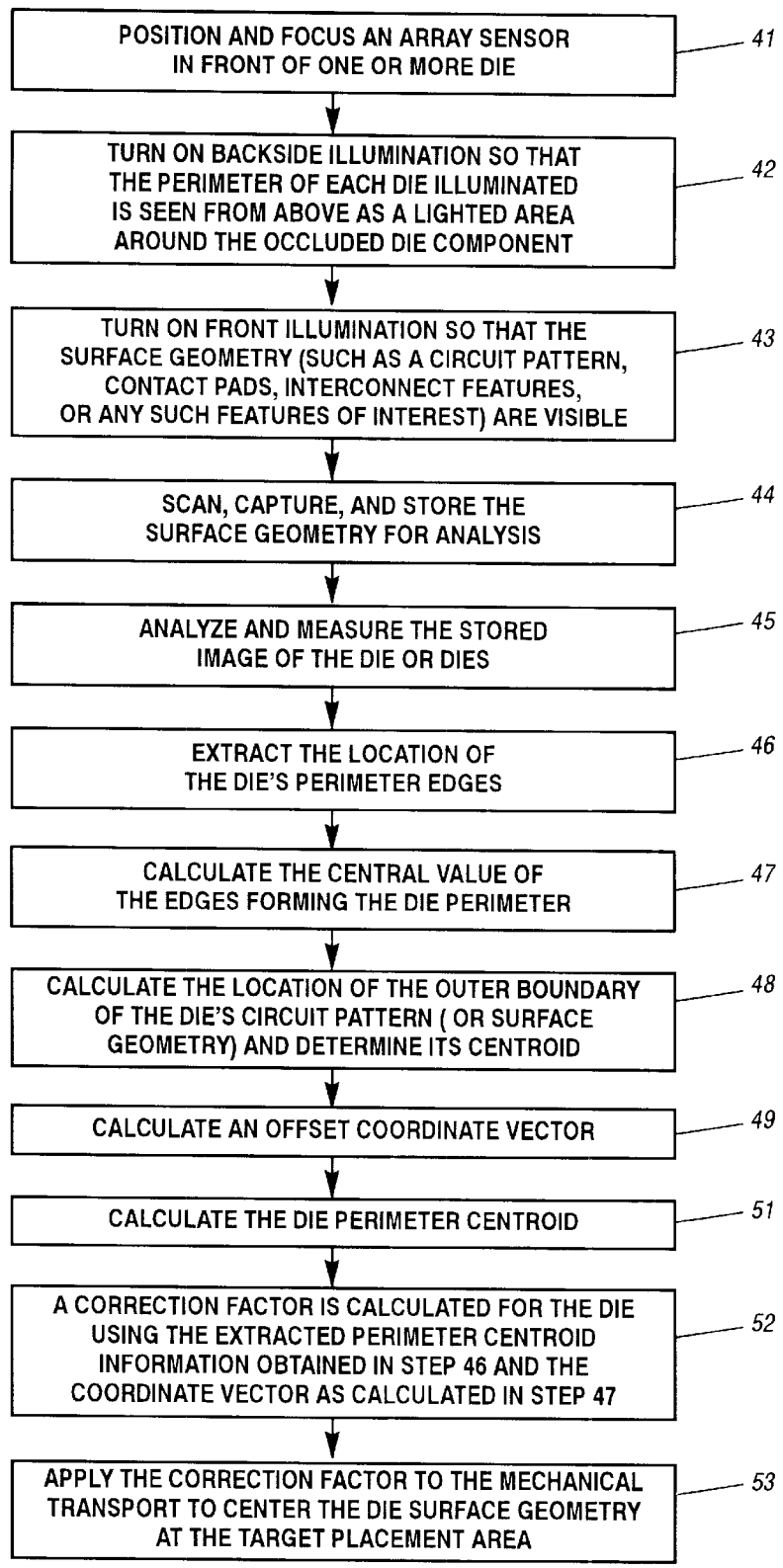
FIG. 4 is a block diagram of a prior art method of placing a die on a target position placement area when position of pattern on the die is known relative to the outer perimeter edges of the die.

Refer now to FIG. 4 showing a prior art method of placing a die on a target placement area so that the position of the circuit pattern on the top of the die is placed on or over a desired die registration area on the substrate. In block 41 the look down vision system 12 may be placed over a wafer comprising a plurality of die (not shown) carried on a sticky tape. The sawn wafer permits light from below to shine through the tape at the edges of the die so as to outline a particular die in the wafer which will be acquired and stored in the image processor 18 as shown in block 42. In block 43 the feature of the circuit pattern on the front face of the die surface is illuminated and made visible. In block 44 the circuit pattern and the outer perimeter edges of the die are scanned into the image processor for analysis. In block 45 the process of analysis of the stored information which will be discussed hereinafter proceeds. In block 46 the outer edges of the die's perimeter are extracted in terms of polar coordinates. In block 47 a central value of the edges forming the die's perimeter is calculated as shown at block 47. With the edges of the die perimeter calculated it is now possible to calculate the outer boundary of the die's circuit pattern and to determine the centroid of the circuit pattern as shown at block 48. At block 49 another calculation is made including an offset vector for the above centroid. At block 51 a second centroid is calculated for the center of the die perimeter. At block 52 a correction factor is calculated for the die pattern using the extracted centroid's information claimed in steps 46 and 47 and finally the correction factor is applied to the mechanical X-Y transport system of the pick and place machine 10 as shown at block 53. It will be observed that the above calculation requires a centroid for the circuit pattern as well as a centroid for an approximate area of the outer perimeter of the die using a calculation of polar coordinates. It will also be observed that the centroid of the outer perimeter of the die component will not be the same as the centroid observed by the aforementioned described horizontal vision system. The problem with the method described in FIG. 4 is that the calculation is highly complex and assumes that the outer perimeter edges of the die are not parallel to the edges of the circuit pattern, thus, the die edges are placed at some minor angular rotation deviation from the zero rotational position of the pattern observed by the look down vision system 11.

The method shown and described in FIG. 4 is explained in greater detail in U.S. Pat. No. 6,031,242 which is incorporated by reference herein. The method set forth in FIG. 4 was designed for picking die from a sawn or diced wafer presumably mounted on a strip of flexible sticky tape such as Nitto™ tape. The diced wafer is sawn through the wafer but not through the sticky tape, thus leaving a transparent street between die so that the wafer may be back lighted and the streets visually highlighted to a look down vision system 13 of the type employed in prior art vision systems. This enables the modified control system to determine the centroid of the pattern of the die as well as the centroid of the perimeter of the die but employs a complex calculation to obtain this information which may or may not be the same as the information obtained with a highly accurate horizontal vision system of the type shown in FIG. 3.

For example, if the component 17 to be placed is a surface mount component with highly accurate protruding pins or balls that are indicative of the pattern on the top surface it is possible to use the prior art system shown in FIG. 3 to accurately place the component at a desired target or placement location on a substrate or printed circuit board and to ignore the pattern or target on the top of the component. However, when the component 17 to be placed does not have such a set of connector pins or balls it is necessary to determine the location of the desired surface pattern and employ that information to place the component 17 on a substrate 14.

Figure 5:
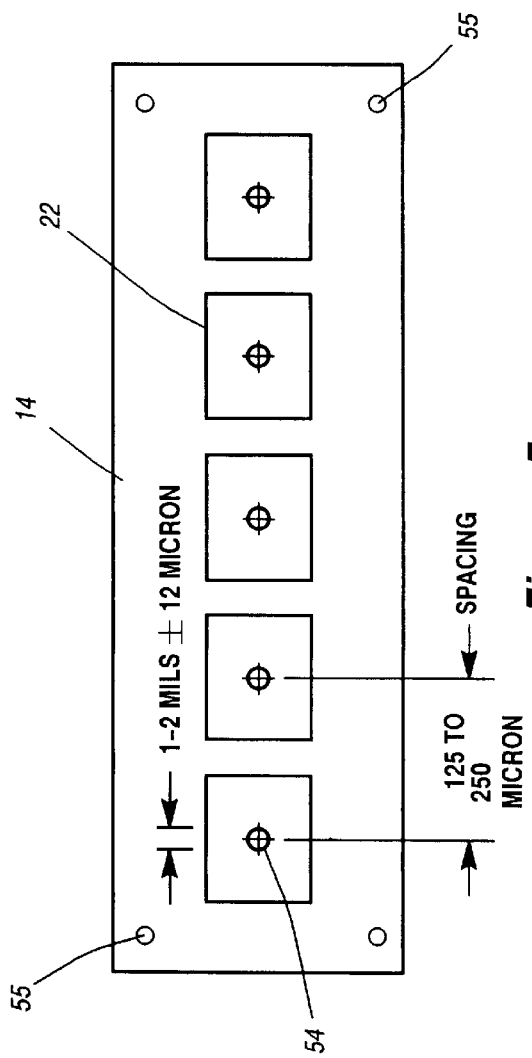
FIG. 5 is a top or plan view of a substrate or PC board showing the target or placement position for the outer perimeter lines of components of die which are to be placed.

Refer now to FIG. 5 showing a top or plan view of a substrate or PC board 14 used as part of a fiber optic connector assembly. The components 22 to be placed on the substrate 14 must be placed with an accurate spacing of preferably 125 or 250 microns as the case may be. The target or feature 54 on the components 22 are typically photo diode emitter or receiver apertures having a target which is one to two mils in diameter and must be placed within ±twelve microns to assure alignment of the fiber optic cable which is not shown. In the embodiment shown the substrate 14 is provided with highly precise registration holes 55 used for mechanical alignment of the connector substrate to be described hereinafter.

Figure 6:
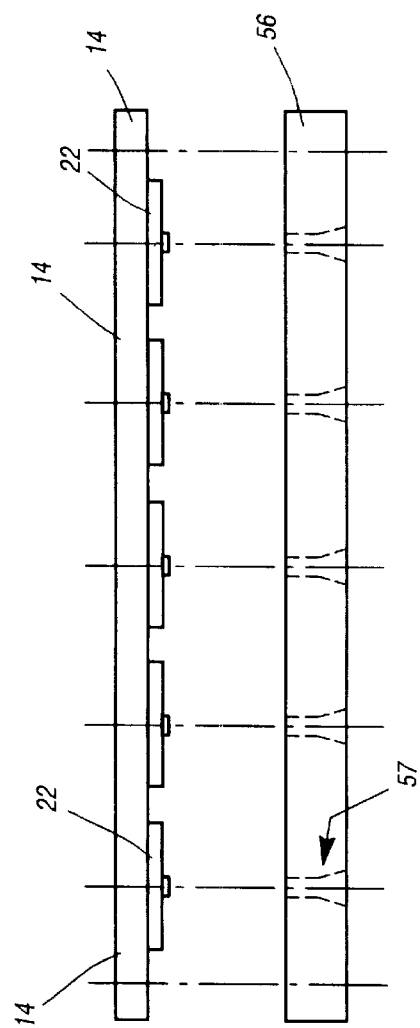
FIG. 6 is an exploded schematic drawing of a fiber optic assembly or connector including a substrate of the type shown in FIG. 5 populated with the photo diodes or photo detectors that are arranged juxtaposed a guide plate used to accurately position fiber optic cables in coincidence with the active element or feature on the die.

Refer now to FIG. 6 showing a side elevation of a fiber optic connector or assembly including the substrate 14 shown and described in FIG. 5. The connector assembly of FIG. 6 includes an alignment or guide plate 56 which is provided with conical converging apertures 57 which will cause a fiber optic cable to align in precise X-Y position with the target 54 on component 22. It is presumed that the connector assembly is made highly accurate and well within tolerances for deviation so that the placement of a fiber optic cable through the alignment aperture 57 will exactly coincide with the eye point 54 which comprises the center of the active element of the photo diode sensor or receiver. It will be observed that the components 22 placed on the substrate 14 would precisely register the feature 54 on its target position and in alignment with the aperture 57 even if the component 22 has a pattern which is slightly rotated from the outer perimeter of the die. Thus, it is possible to eliminate numerous of the prior art steps and calculations and achieve a more precise placement of the feature 54 than was heretofore possible using a prior art pick and place machine.

Figure 7:
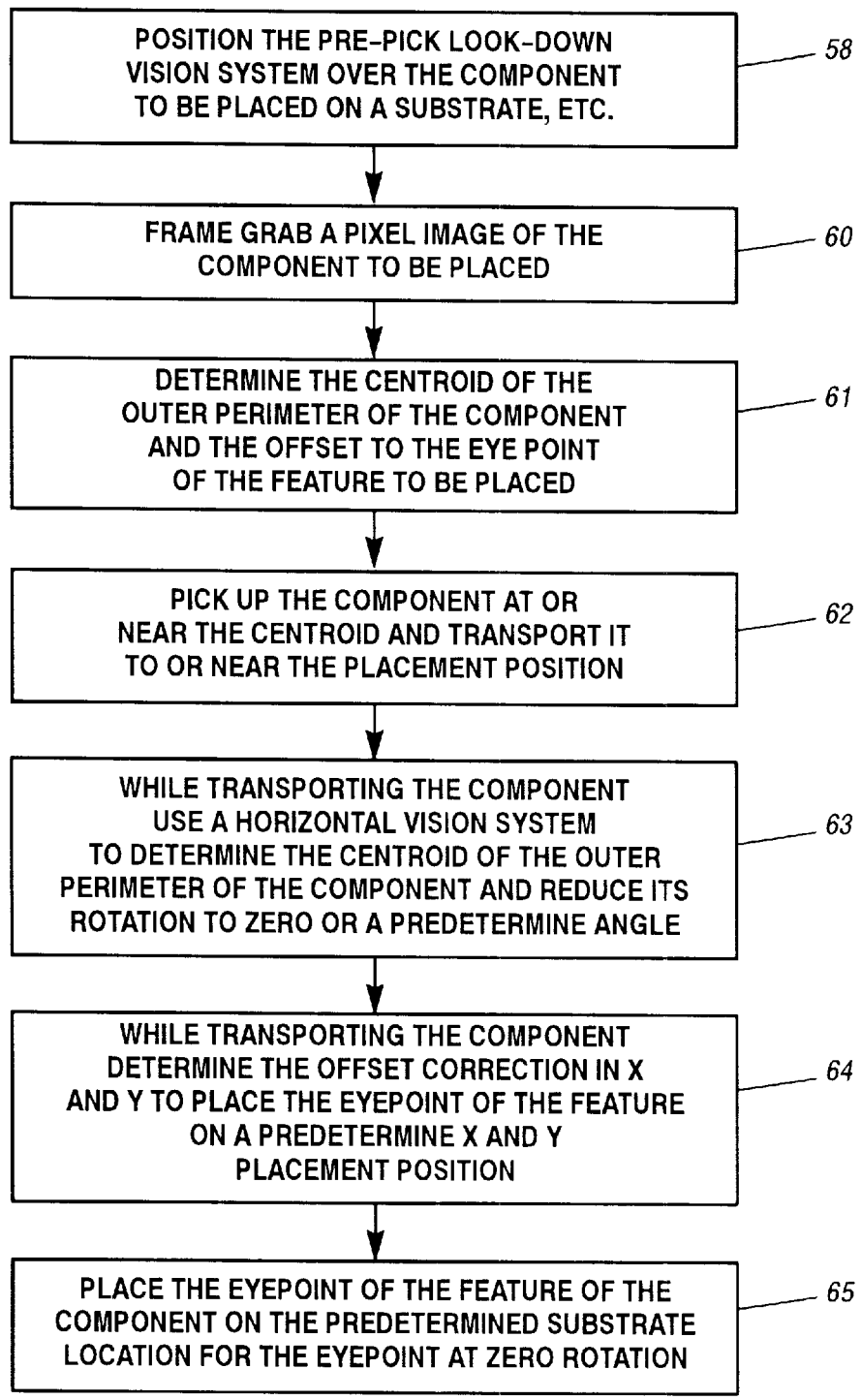
FIG. 7 is a block diagram or flow chart of the preferred embodiment method steps employed to accurately place an active predetermined eye point feature of a component on an exact X-Y location on a substrate.

Refer now to FIG. 7 showing a block diagram or flow chart of the preferred embodiment method steps employed to accurately place an active predetermined eye point 54 feature of a component on an exact X, Y location on a substrate 14. The blocks or method steps of FIG. 7 are to be considered with reference to a prior art pick and place machine shown in FIG. 1 having the modification shown in FIG. 2. In this regard, the block 58 shows that the look down vision system 12 is placed over the component to be picked up and placed on the substrate 14. In the next step the vision system does a frame grab or pixel image or pixel map of the component to be placed and stores it in the image processor 18. In block 61 the image processor determines the centroid of the outer perimeter of the component and the offset of the eye point to the feature to be placed. In block 61 the component is picked up by the nozzle 13 as near to the centroid as mechanically accurate and the component 17 is transported to or near the placement position on substrate 14 as shown in block 62. In block 63 while the component 17 is being transported a horizontal vision system 24 is employed to determine the centroid of the outer perimeter of the component and also to reduce the rotational position of the component to zero or a predetermined angle. It will be noted that the steps shown in blocks 58 through 63 are steps that have been performed in the prior art systems. In block 64 while transporting the component to the substrate 14 it is possible to determine the offset correction in X and Y to place the eye point 54 of the feature on a predetermined X and Y placement position without knowing whether a pattern on the component 17 is tilted or not in perfect parallel alignment with the edges of the component aligned by the horizontal vision system 24. In the final step the eye point 54 of the feature of the component 17 may be placed on an exact X and Y location on the substrate for the eye point disregarding the minor rotation of the pattern if such exists. In the above system the exact location of the eye point has been determined within three to five microns using a state of the art horizontal vision system such as the Quad align system shown and described in U.S. Pat. No. 5,559,727.

Figure 8:
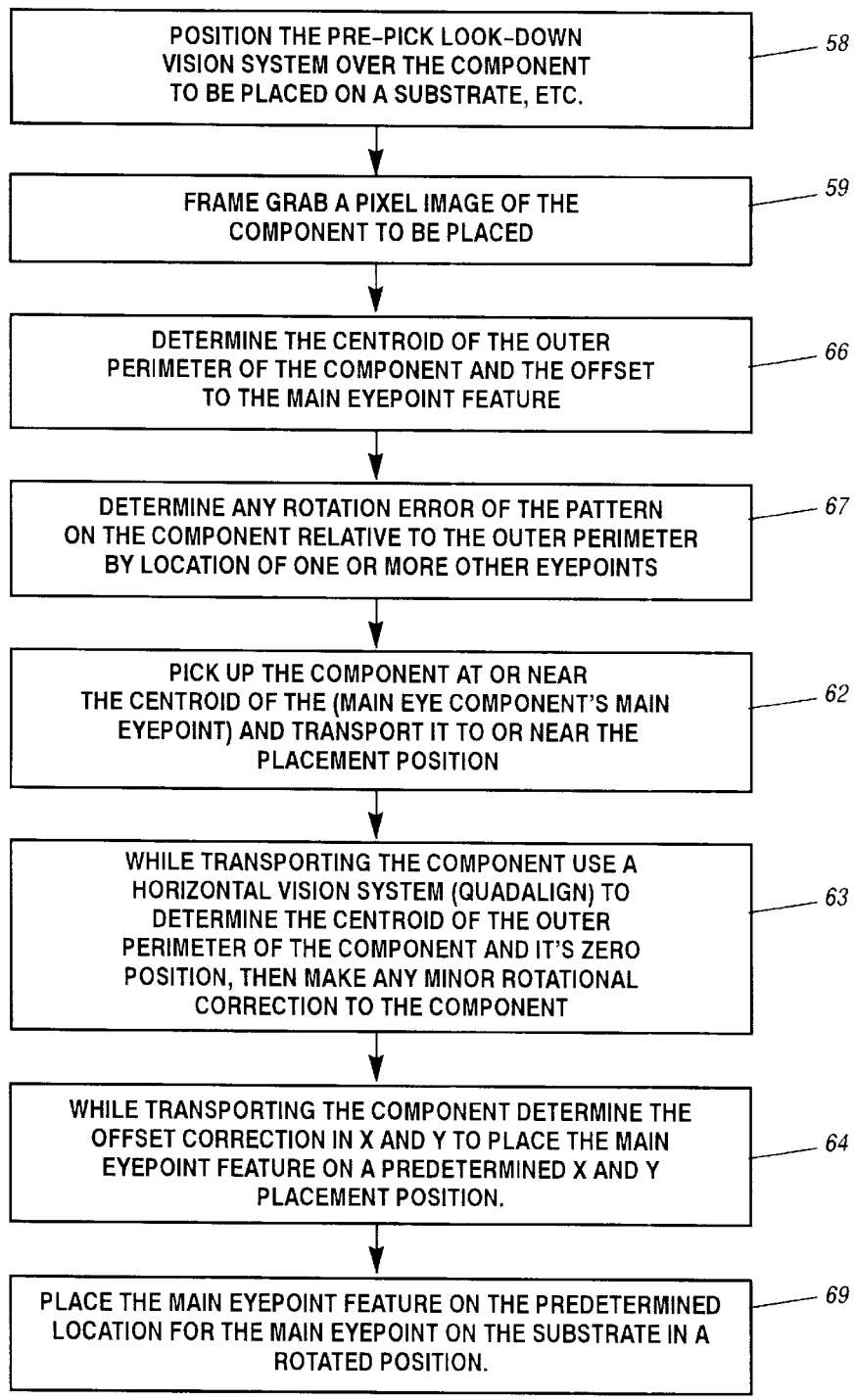
FIG. 8 is a block diagram or flow chart of a modified embodiment method steps employed to accurately place a plurality of active predetermined eye point features of a component on their exact X and Y placement points on a substrate.

Refer now to FIG. 8 showing a block or flow diagram chart of a modified embodiment method employed to accurately place a plurality of active predetermined eye point features on a component onto their exact X and Y placement positions on a substrate 14.

Employing the vision system shown and described in FIGS. 1 to 3, the blocks 58 and 59 are the same as those described hereinbefore with reference to FIG. 7 and do not require additional explanation. Block 66 determines the centroid of the outer perimeter of the component and the offset to the main eye point feature which will be employed as explained hereinafter. In block 67 any rotational error of the pattern on the component relative to the outer perimeter is determined by location of one or two more eye points on the component 17. Block 62 is the same as previous block 62 in the FIG. 7 and the component is picked up at or near the pick up centroid. In block 68 while transporting the component at or near the placement position a horizontal vision system of the type employed in FIG. 7 is used to determine the centroid of the outer perimeter of the component and its zero or orthogonal position for placement that would have occurred in block 64 of FIG. 7. However, the additional calculation is made of the minor rotational correction for aligning two or more eye points. In block 64 while transporting the component the offset correction in X and Y is made as previously described in block 64 of FIG. 7, then subsequently in block 69 the main eye point feature is placed at the predetermined location for the main eye point on the substrate and the component is rotated in block 68 so that all eye points coincide with predetermined placement position for a plurality of eye points.

Stated differently, FIG. 8 differs from FIG. 7 in that only one main eye point has to be placed at a predetermined X-Y target or placement position and that the rotation of the other eye points relative to the main placement eye point is determined so that a rotation correction may be made in block 68 which results in the placement of a plurality of eye points in or on exact target or placement positions.

Having explained a preferred embodiment of the present invention, it will be understood that only minor software modifications need to be made to existing commercially available pick and place machines such as the APS1 provided by Tyco International in Willow Grove, Pa. However such machines as made by Universal Instrument, Seimens and several Japanese companies may be modified using the invention described herein.

What is claimed is:

1. A method of placing a component on a substrate so that an eye point feature of the component exactly coincides with a predetermined target or placement feature on a substrate, comprising the steps of:

sensing the component before pick up with a look down vision system, storing a pixel image of the component in a processing means, determining the centroid of the outer perimeter of the component to be picked up and the centroid of one or more eye point features to be placed on the substrate, picking up the component at or near the centroid of the component and transporting it to or near a placement position, while transporting the component, determining the centroid of the outer perimeter of the component with a horizontal vision system and its orthogonal or zero rotational position, while transporting the component, determining any offset correction in the X and Y axes to place a predetermined eye point on a predetermined X and Y placement target position on the substrate, and placing said eye point of the feature of the component on said predetermined location on said substrate.

2. The method as set forth in claim 1 wherein said component is placed on said substrate at zero degrees of rotation as seen by the horizontal vision system.

3. The method as set forth in claim 1 wherein determining any offset comprises determining the centroid of more than one eye point, determining the rotational position of the features of the component, and the step of transporting further includes correcting the rotational position of the component so that all eye points coincide with predetermined placement positions on said substrate.

4. A method for placing a component at a predetermined placement position on a substrate or carrier, comprising the steps of:

sensing the position of the outer perimeter edges of an active feature of the component before picking up the component with a look down vision system, picking up the component from a supply source with a pick and place pick up tool and a pick up head of a pick and place machine, raising the component into a horizontal vision system and transporting the component to an approximate place position over a substrate or carrier, calculating the offset distance of the delta X and delta Y position of the active feature of the component from its perimeter edges, determining the position of the perimeter edges of the component relative to the placement system, and placing the axis of the active feature of the component on a predetermined X and Y position of the substrate or carrier.

5. A method of placing a desired feature of a component at an exact predetermined placement location on a substrate or carrier, comprising the steps of:

sensing both the outer perimeter edges and the desired feature of the component prior to pick up with a look down vision system, picking up the component by engaging the top of the component with a vacuum pick up tool, raising the component into a horizontal vision system, moving the component to an approximate placement position over said substrate while determining the centroid of the component to be placed and determining an X and Y correction position for the centroid of the component and then placing the eye point of the feature on the component on a predetermined location of said substrate.

* * * * *